United States Patent
Matei et al.

(10) Patent No.: US 11,580,267 B2
(45) Date of Patent: Feb. 14, 2023

(54) SYSTEM AND METHOD FOR AUGMENTING LUMPED PARAMETER MODEL DIAGNOSIS ENGINE

(71) Applicant: Palo Alto Research Center Incorporated, Palo Alto, CA (US)

(72) Inventors: Ion Matei, Sunnyvale, CA (US); Saigopal Nelaturi, Mountain View, CA (US); Johan de Kleer, Los Altos, CA (US); Clinton Morris, Sunnyvale, CA (US); Aleksandar B. Feldman, Santa Cruz, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 183 days.

(21) Appl. No.: 16/793,375

(22) Filed: Feb. 18, 2020

(65) Prior Publication Data
US 2021/0256170 A1    Aug. 19, 2021

(51) Int. Cl.
*G06F 30/10* (2020.01)
(52) U.S. Cl.
CPC .................................. *G06F 30/10* (2020.01)
(58) Field of Classification Search
CPC ...................................................... G06F 30/10
See application file for complete search history.

(56) References Cited

U.S. PATENT DOCUMENTS

| | | | | |
|---|---|---|---|---|
| 5,408,412 A | * | 4/1995 | Hogg | G01M 15/05 701/29.1 |
| 2003/0061004 A1 | * | 3/2003 | Discenzo | G05B 13/024 702/182 |
| 2009/0018802 A1 | * | 1/2009 | de Kleer | G06F 30/3323 703/2 |
| 2010/0010654 A1 | * | 1/2010 | de Kleer | G05B 19/41865 700/97 |
| 2014/0201571 A1 | * | 7/2014 | Hosek | G05B 23/0221 714/26 |
| 2017/0193143 A1 | * | 7/2017 | Saha | G06F 30/20 |

FOREIGN PATENT DOCUMENTS

CN          109147933 A   *   1/2019   ........... G05B 23/021

OTHER PUBLICATIONS

Peter Struss and Chris Price; "Model-Based Systems in the Automotive Industry"; AI Magazine vol. 24 No. 4 (2003) (Year: 2003).*

(Continued)

*Primary Examiner* — Rehana Perveen
*Assistant Examiner* — Nupur Debnath
(74) *Attorney, Agent, or Firm* — Mueting Raasch Group

(57) ABSTRACT

A target system is coupled to a diagnosis engine that uses a lumped parameter model of the system for diagnosis. A proximity search in is performed in a computer-aided design model of the system to find groups of components that may be affected by resistive or parasitic interactions between the individual components in the groups. The lumped parameter model is augmented by adding elements that emulate the resistive or parasitic interactions between the individual components in the groups. The augmented lumped model is used by the diagnosis engine to perform diagnosis on the system.

20 Claims, 10 Drawing Sheets

(56) References Cited

OTHER PUBLICATIONS

Alexander Feldman et al.; "Approximate Model-Based Diagnosis Using Greedy Stochastic Search"; Journal of Artificial Intelligence Research 38 (2010) 371-413 (Year: 2010).*
Amir Fijany et al.; "A Novel Model-Based Diagnosis Engine: Theory and Applications"; IEEEAC pper#131 I, Updated Sep. 19, 2002 (Year: 2002).*
Shen Zhang et al. "Machine Learning and Deep Learning Algorithms for Bearing Fault Diagnostics—A Comprehensive Review" (Year: 2019).*
Ziyang He; "A medial axis transformation based process planning method for rapid tooling" Iowa State University, Digital repository; Graduate Theses and Dissertations (Year: 2017).*
Ion Matei et al.; "Learning constitutive equations of physical components with constraints discovery"; 2018 Annual American Control Conference (ACC) (Year: 2018).*
Leila Zehtaban et al.; "A framework for similarity recognition of CAD models"; Journal of Computational Design and Engineering 3 (2016) 274-285 (Year: 2016).*
Ion Matei et al; "The Case for a Hybrid Approach to Diagnosis: A Railway Switch"; Proceedings of the 26th International Workshop on Principles of Diagnosis (Year: 2015).*
Raj Minhas et al.; "Using Fault Augmented Modelica Models for Diagnostics"; Proceedings of the 10th International Modelica Conference Mar. 10-12, 2014 (Year: 2014).*
Jacob A. Free et al.; "Computational Heat Transfer Platform for Frequency Domain Reliability Design"; https://ieeexplore.ieee.org/stamp/stamp.jsp?tp=&arnumber=8769619 (Year: 2019).*
Naghi Rostami et al.; "Lumped-Parameter Thermal Model for Axial Flux Permanent Magnet Machines"; (Year: 2013).*
Siamak Salimy et al.; "A unified analytical and scalable lumped model of RF CMOS spiral inductors based on electromagnetic effects and circuit analysis"; Solid-State Electronics 61 (2011) 38-45 (Year: 2011).*
Fritzon, Principles of Object-Oriented Modeling and Simulation with Modelica 3.3: A Cyber-Physical Approach, 2nd ed. Hoboken, NJ: Wiley, 2015.
Girija et al., "TensorFlow: Large-Scale Machine Learning on Heterogeneous Systems", 2015.
Juhasz et al., "Automatic Model Conversion to Modelica for Dymola-based Mechatronic Simulation," in Modelica 2008: Proceedings of the 6th International Modelica Conference; Mar. 3 and 4, 2008, pp. 719-726.
Paszke et al., "Automatic differentiation in PyTorch," 2017.
Tiller, "Parsing and Semantic Analysis of Modelica Code for Non-Simulation Applications," in Proceedings of the 3rd International Modelica Conference, 2003, pp. 411-418.

* cited by examiner

```
model Resistor
   extends Interface.OnePort;

parameter SI./Resistance R = 1 "Resistance";

Modelica.Thermal.HeatTransfer.Interfaces.HeatPort a heatPort;
equation
   v = R*i;
end Resistor;
```

*FIG. 6*

```
model Resistor
   extends Interface.OnePort;

parameter SI./Resistance R = 1;
   parameter SI.Temperature T_ref=300 "Reference temperature";
   parameter Real alpha (unit="1/K" = 0 "Temperature coefficient of
resistance";
   SI.Resistance R "Resistance = R_ref* (1 + alpha* (heatPort.T_ref));";

Modelica.Thermal.HeatTransfer.Interfaces.HeatPort a heatPort;
equation
   v = R*i;

if cardinality (heatPort) > 0 then
      R = R_ref* (1 + alpha* (heatPort.T - T_ref));
      heatPort.Q_dot = -v*i;
   else
      /* heatPort is not connected resulting in the
         implicit equation 'heatPort.Q_dot = 0'
      */
      R = R_ref;
      heatPort.T =T_ref;
   end if;
end Resistor;
```

*FIG. 7*

```
model ElectricCircuit
    ...
    Modelica.Electrical.Analog.Basic.Resistor R1;
    Modelica.Electrical.Analog.Basic.Resistor R2;
    Modelica.Electrical.Analog.Basic.Resistor R3;
    Modelica.Electrical.Analog.Basic.Resistor R4;
    ...
equation
    connect (R1.p, R2.n) ;
    connect (R3.p, R4.n) ;
    ...
end ElectricCircuit;
```

FIG. 10

```
model ElectricCircuit
    ...
    Modelica.Electrical.Analog.Basic.Resistor R1;
    Modelica.Electrical.Analog.Basic.Resistor R2;
    Modelica.Electrical.Analog.Basic.Resistor R3;
    Modelica.Electrical.Analog.Basic.Resistor R4;
    Modelica.Electrical.Analog.Basic.Capacitor Ceps;
    ...
equation
    connect (R1.p, R2.n) ;
    connect (R3.p, R4.n) ;
    connect (R1.p, Ceps.p) ;
    connect (R3.p, Ceps.n);
    ...
end ElectricCircuit;
```

FIG. 11

SYSTEM AND METHOD FOR AUGMENTING LUMPED PARAMETER MODEL DIAGNOSIS ENGINE

SUMMARY

The present disclosure is directed to enhanced lumped model based diagnosis. In one embodiment, a target system is coupled to a diagnosis engine that uses a lumped parameter model of the system for diagnosis. A proximity search in is performed in a computer-aided design model of the system to find groups of components that may be affected by resistive or parasitic interactions between the individual components in the groups. The lumped parameter model is augmented by adding elements that emulate the resistive or parasitic interactions between the individual components in the groups. The augmented lumped model is used by the diagnosis engine to perform diagnosis on the system.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures. The drawings are not necessarily to scale.

FIGS. 6 and 7 are code listings showing the insertion of a heat transfer resistance element into a lumped parameter model according to an example embodiment;

FIGS. 10 and 11 are code listings showing the insertion of a parasitic capacitive element into a lumped parameter model according to an example embodiment;

DETAILED DESCRIPTION

Figure 1:
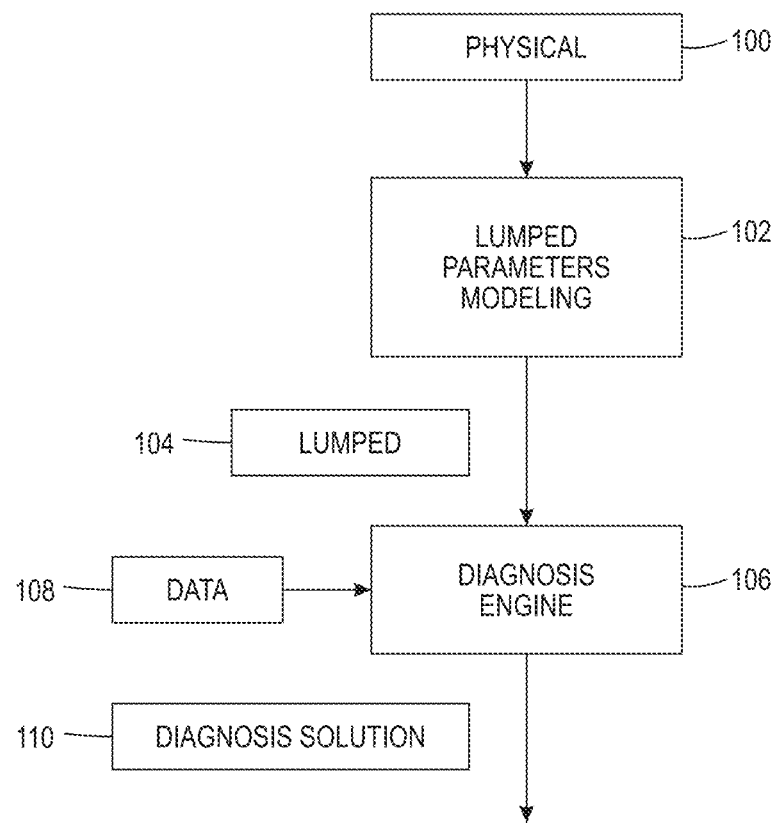
FIG. 1 is a block diagram showing a diagnosis engine that uses lumped parameter models according to an example embodiment.

The present disclosure relates to model-based diagnosis (MBD). In MBD, the diagnosis engine is provided with a model of the system, values of the parameters of the model and values of some of its inputs and outputs. An example MBD engine is shown in the block diagram of FIG. 1. Physical inputs 100, such as geometry, materials, boundary conditions, power/heat input, etc., are used by a lumped parameter (LP) modeling component 102 that models a system. For purposes of this example, the system includes an apparatus that can be monitored in real-time (or near real-time) by a diagnosis engine 106. The physical parameters 100 may describe both the apparatus and the environment in which the apparatus is expected to operate.

The LP modeling component 102 produces a LP model 104, which is used by the diagnosis engine 106. The LP model 104 contains mathematical representations of the system components and interactions among them. The diagnosis engine 106 also receives data 108, e.g., from sensors on or near the apparatus, from operator inputs, from data stored via the apparatus, etc. The data 108 is applied to the LP model 104 to produce a diagnosis solution 110. The diagnosis solution 110 may be a real-time indicator of system status and/or may be used for post-hoc diagnosis, e.g., to help identify a cause of a failure after the failure has been detected.

Goals of an MDB system such as shown in FIG. 1 may include any combination of determining whether the system is malfunctioning, which components might be faulty and what additional information needs to be gathered (if any) to identify the faulty components with relative certainty. An MBD system often uses LP models due to relative simplicity of such models, and due to the fact that they can be simulated and solved quickly if the size is kept reasonable. Lumped parameter models may be described using physics-based modeling languages such as Modelica® or Simu-link®/Simscape™.

If the LP models are too complex (e.g., tens of thousands of equations), their simulation time is too high (e.g., up to tens of minutes), then they may be unusable for real-time applications. An MBD engine reasons about dependencies between components and how changes in one component affects other components. An MBD engine can detect changes in the system behavior and it can explain the reason for such changes assuming that the model captures the phenomenon. Computer Aided Design (CAD) models are more detailed models of physical systems that include the 3D geometry of individual components, how they are assembled together through several sub-assembly levels to create an assembly describing the whole system. The CAD models enable system analysis (e.g., finite element analysis, or computational fluid dynamics) but they are too complex to be used in real time application such as diagnosis.

It is very time-consuming and cumbersome to manually create a parametric simulation model representing a complex product that has been designed in a CAD system. There exist methods that automatically generate LP models from CAD models. Such methods use manipulation of integral properties to generate lumped parameters and simplified component behavior descriptions and they focus on how energy flows are transmitted and processed between connected components. However, there can be unintended interactions between components that are not included in the LP models. For example, continuous use of a component generates heat that can affect neighboring components, even in the cases they are not in direct contact.

Figure 2:
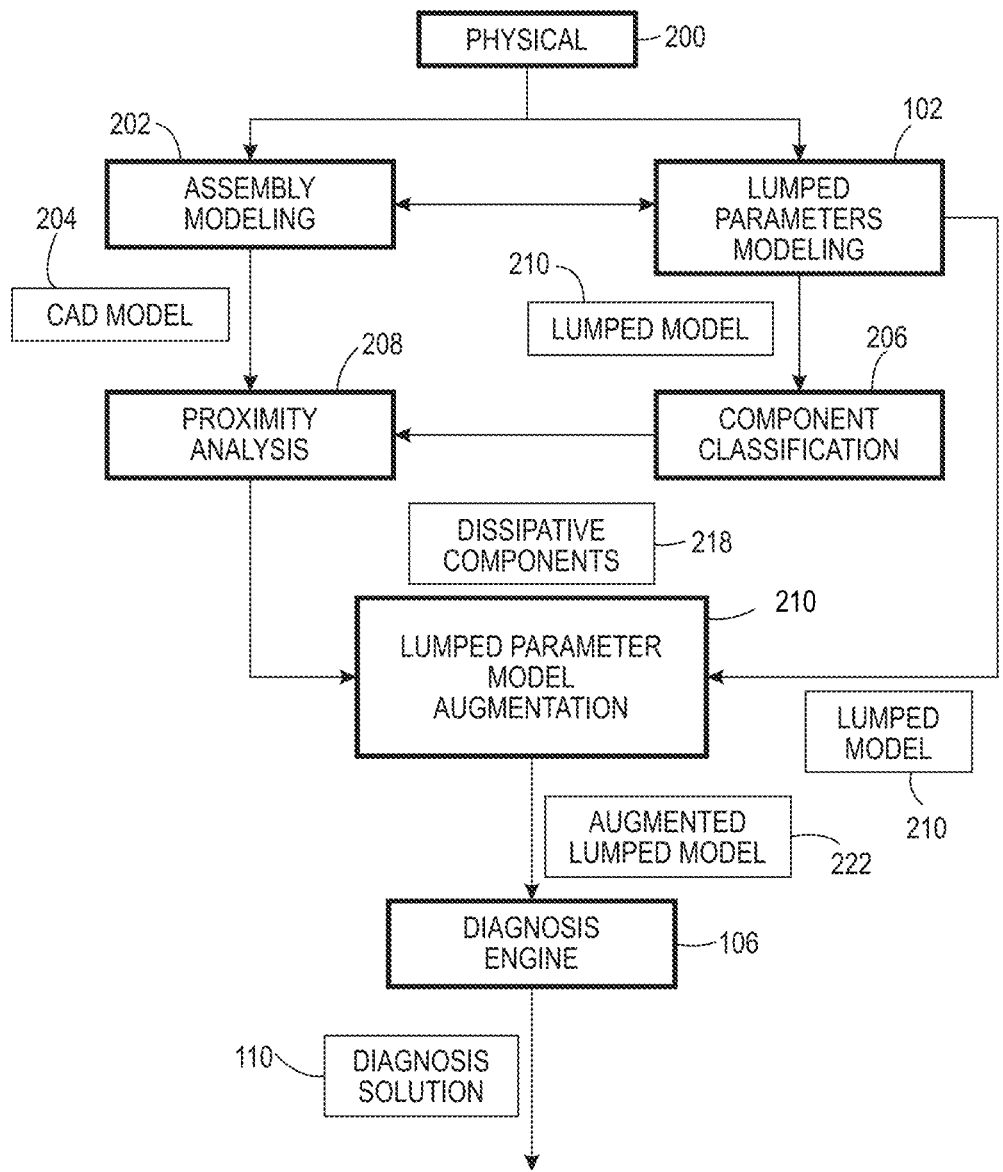
FIG. 2 is a block diagram showing a method according to an example embodiment.

Methods and systems described herein use both CAD and corresponding LP models to augment the LP model with behavior describing unintended interactions. A hidden interaction model connects context and behavior to the impact of the interaction on the overall system behavior. The principle of geometric adjacency is utilized in interaction detection. In FIG. 2, a diagram shows steps of a method according to an example embodiment. The method assumes access to a CAD model 204 of the physical system 200 that includes assemblies and subassemblies levels. A lumped model 104 of the physical system is assumed available as well, where the model is built using expert knowledge or using an automated method.

This method shown in FIG. 2 determines unintended interactions between components of the physical system 200 due to, for instance, heat dissipation and electro-magnetic interactions (EMI). For example, electrical resistors, dampers, motors dissipate heat when used for long time periods, increasing the temperature of the nearby components. This heat transfer may occur via any combination of conduction, convection, and radiation. Other examples of interactions include parasitic capacitance between neighboring wires or air vortexes interaction when quadcopter blades are too close. The parasitic capacitance appears when two electrical conductors at different voltages are close together. The electric field between them causes electric charge to be stored on them and hence the appearance of parasitic capacitance.

Sub-processes of the method shown in FIG. 2 include component classification 206 (performed on the LP model 104), proximity analysis 208 (performed on the CAD model 204) and model augmentation 210 (performed on the LP model 104). In the component classification process 206, the LP model 104 is analyzed, and the resistive components are detected and classified as such. The method uses component function type (e.g., resistive components) and interface type to localize the interactions. In one embodiment, model parsers are used that build abstract syntax trees (AST) from the source file (e.g., Modelica model) using the AST data types. The AST keeps the structure of the source file and gives access to the component types and parameters.

The AST component types can be used to identify resistive components in the classification process 206. For example, Modelica library has a known list of resistive components, e.g., resistors, conductors, diodes, mechanical dampers, pipes, etc. Additionally, components interfaces can be used to identify the potential for heat transfer. Components with thermal connectors are of interest, for example. Also, components that do not fit the previous two cases can be tested for the dissipative property. For example, machine learning regression algorithms can be used to formulate and solve a constrained optimization (regression) problem of the form shown in Eq. (1), where f and e are flow and effort variables (e.g., current and voltage, respectively), and $f_s^{(i)}$ and $e_s^{(i)}$ are simulated samples of flow and effort variables.

$$\min_w \sum_{i=1}^N |f_s^{(i)} - f^{(i)}|^2 + |e_s^{(i)} - e^{(i)}|^2 \quad (1)$$
$$\text{subject to}: \begin{array}{l} f(t) = \varphi(e(t); w) \\ \varphi(e; w) \text{ is invertible} \end{array}$$

The objective is to learn the map $\varphi(e; w)$, where a neural network map representation can be chosen. The simulated data are generated by placing the component into a test bed where the component is connected to flow and effort sources, and simulated. The regression problem can be implemented and solved on deep learning platforms, e.g., Pytorch™ or TensorFlow™. A component is classified as resistive provided a good fit is found (e.g., the MSE loss function is small).

For modeling of electromagnetically interacting components in the classification step 206, the AST can be used to identify connections between electric components. In the Modelica language, for example, the connections are indicated by "connect" statements. Such statements indicate the possible existence of a wire between two or more electric components. Alternatively, components that use electric connectors, (e.g., pins) can be found that are connected to other electric connectors. The result of classification process 206 is a list of components 218 that have the potential for heat dissipation and/or components with the potential of having a wire between them. This list of components 218 is used by proximity analysis 208, which also utilizes the CAD model 204.

In the proximity analysis 208, each component 218 with the potential for heat dissipation or EMI is considered. In the case of heat dissipation, components in contact or close to each other are identified. In the EMI case, electric components connected through a wire are identified. Note that both EMI and heat dissipation may be applicable to some components. For example, an electrical coil (e.g., inductor, transformer) may both generate significant heat and have conductors that can induce EMI. The CAD model 204 is use for the proximity analysis 208. Given a set of CAD assemblies, the nearness of every part in each assembly to every other part in other assemblies is quantified as described below.

The first case analyzed assumes that the assemblies are static, e.g., the parts are not in relative motion with one another. In this case, the entire assembly may be treated as a single rigid body, and the problem amounts to quantifying the nearness between each pair of rigid bodies in the collection. A preliminary interference analysis may be performed to ensure the rigid solids do not collide with each other. If components do collide, they may be treated as a single object for this analysis, treated as contacting objects (e.g., for small collisions), or may be flagged as an error.

For the assemblies, a distance field can be computed, for example, by sampling points in each rigid body and computing pairwise distances using graphics hardware. One such technique is described at gamma.cs.unc.edu/DIFI/. The calculations assume that the medial axis is the set of all points where the distance field is non-differentiable. There will be a medial axis on the interior of each rigid body, and similarly a medial axis in the free space between all rigid bodies. The former is not of interest in this case, and the exterior (free space) medial axis is extracted by evaluating non-differentiable points on the distance field at points outside the rigid bodies. The calculations also assume that the points on the medial axis are equidistant from at least two points, such that each of the two points is located on a distinct rigid body. Thus, the points on the medial axis provide a measure of how close the closest pair of points are on any pair of shapes.

Figure 3:
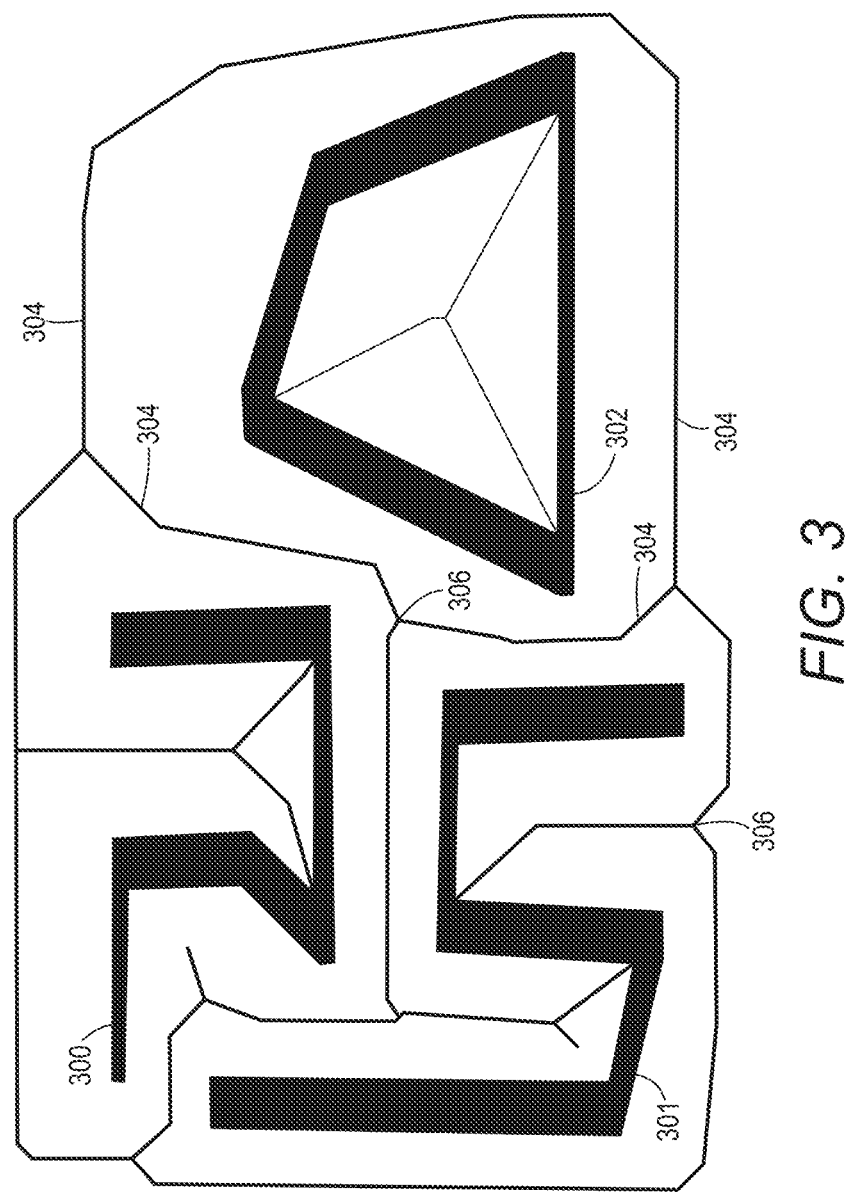
FIG. 3 is a diagram showing the calculation of a distance field between components according to an example embodiment.

In FIG. 3, a diagram shows how the medial axis is computed according to an example embodiment. Assemblies 300-302 are abstract shapes that represent physical components in two-dimensions. External medial axes 304 are computed around the assemblies 300-302. Any point on the medial axis 304 is equidistant between at least two points among the rigid solids, or equidistant between one of the solids and the image boundary. Note that vertices (e.g., vertices 306) on the external medial axis 304 are equidistant from at least three points on the rigid solids 300-302.

The points on the medial axis are filtered to retain points that are equidistant from distinct rigid bodies. This set of points and the corresponding distance fields at each point represents the proximity between distinct combinations of rigid solids These points and distance fields are used to add components to the proximal component information 220 returned from the proximity analysis 208 shown in FIG. 2. Next, the case where the assemblies are not rigid are considered, e.g., where the parts may be in relative motion.

In this case, a conservative estimate of the proximity between assemblies can be found by replacing the dynamic, moving assembly with the workspace of each of its parts, and repeating the analysis above. The possible proximity relationships between two parts can be grouped into contact, interference and clearance. Two parts are in contact, if they touch along low-level geometric entities such as surfaces, curves or points without any shared volume. Two parts are defined as having an interference if a common volume exists between them. Clearance occurs when the distance between two surfaces of two parts is meaningful for the considered assembly, e.g., it is a small, non-null distance between two parts in the assembly.

The result of the proximity analysis 208 is list of components 220 that are in a proximal relation with components with the potential for heat dissipation. The result 220 will include also pairs of components whose connections (e.g., wires) are in close proximity. Combining the results 218, 220 of the processes 206, 208, each component is associated with potential for heat dissipation a list of components in a proximal relation. In addition, each pair of connected electrical components to pairs of connected electrical components that are in a proximal relation. This is used by the LP model augmentation 210 which augments the lumped system model 104 by adding components that model the heat transfer and the parasitic (stray) capacitance. The result is an augmented lumped system model 222 that can be used by the diagnosis engine 106.

Figure 4:
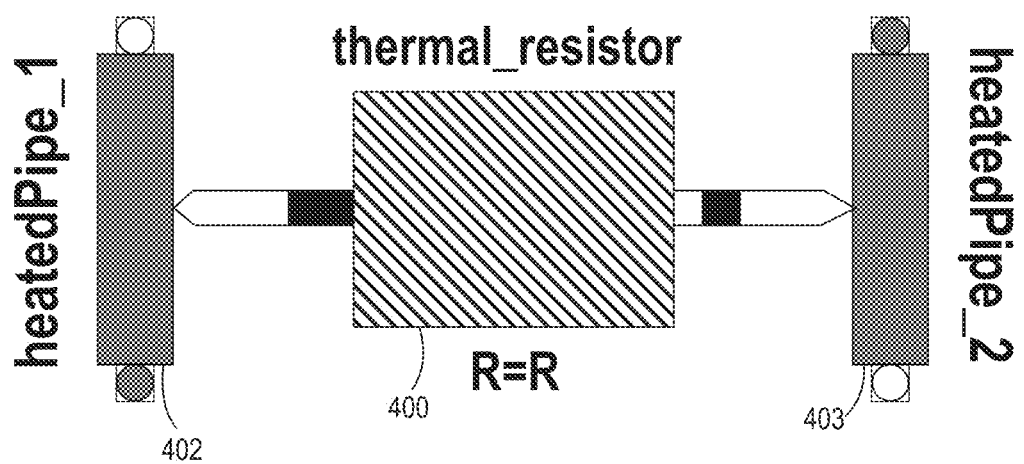
FIGS. 4 and 5 show heat transfer models that may be used in an augmented lumper parameter model according to an example embodiment.
Figure 5:
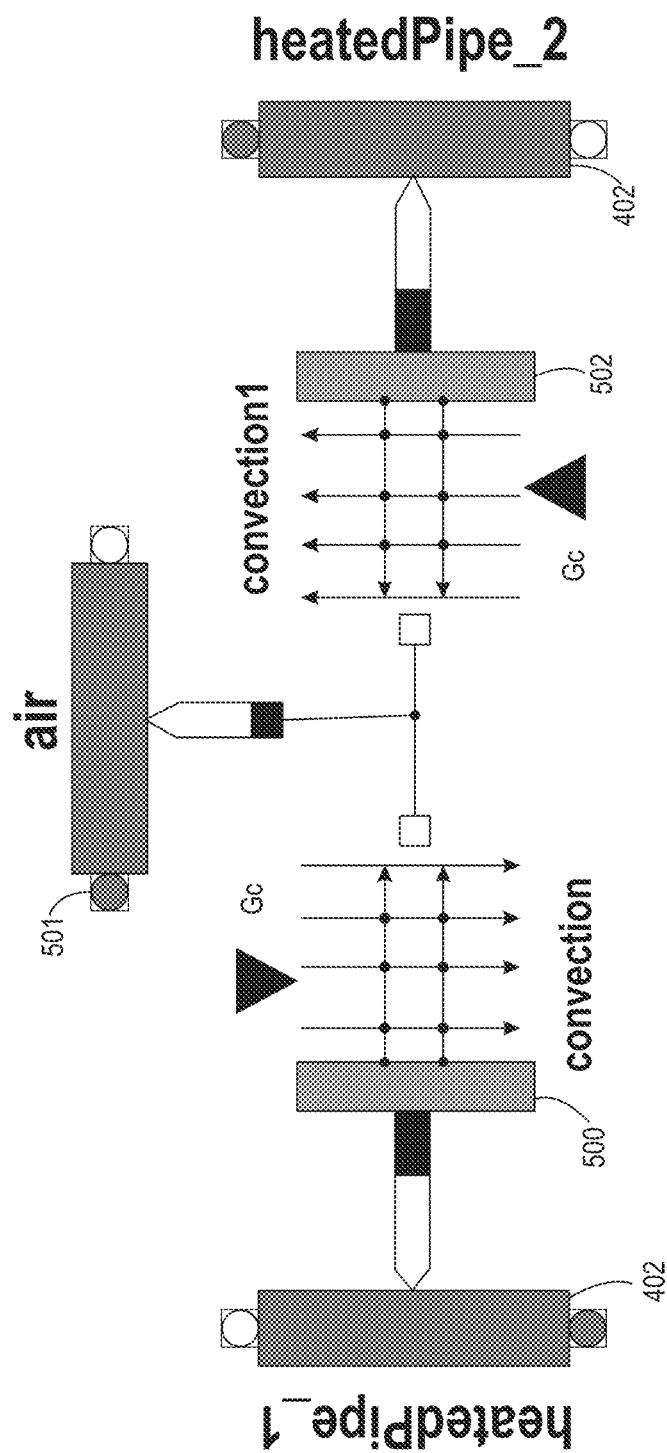

In FIGS. 4 and 5, diagrams show modeling of heat dissipation according to an example embodiment. If a part is in direct contact with another part with a resistive function, components that model conduction type of heat transfer may be included. The diagram in FIG. 4 depicts an example of a thermal resistor 400 added between two pipes 402, 403 that are touching, as found from the analysis of the CAD model. If the parts are not in direct contact but are close and some clearance is present between them, convective type of heat transfer will be modeled using components 500-502 as shown in FIG. 5. It will be understood that similar models may be constructed for radiative heat transfer.

The parameters of the heat transfer components (e.g., heat transfer coefficients) are computed by leveraging information from the CAD models such as contact surface between parts, and material properties. For example, the thermal conductance for a box geometry, under the assumption that heat flows along the box length, is computed as $$G = \frac{kA}{L},$$

where k is the thermal conductivity (material constant), A is the area of the box, L is the length of the box. Similar relationships may be found for radiation, e.g., based on the areas and emissivities of the facing surfaces.

The LP models are automatically re-written and augmented with heat transfer components by using the parsed model, that is, the AST representation. In addition, components that do not contain a thermal interface (e.g., thermal connector) are edited and re-written by changing their power expression to include terms representing the heat transfer and heat ports. In the Modelica language, such a change is executed by replacing the original power equation with a new equation that contains variables of a heat port through which heat transfer is enabled.

A component model comprises one or more lines of code, including, e.g., equations, parameters, variables and/or other content, which defines the component being modeled. The parsed model is examined and/or analyzed to look for content, patterns associated with power expressions. If such an expression is found, then it is replaced. If such an expression is not found, a new expression is added where the power expressed in terms of the component flow and effort variables (e.g., power=current×voltage) is related to the thermal power (e.g., power=temperature×heat flow rate). Once the change is decided, the re-write capability of the parser is used to re-write the AST representing the model, to add new equations, components and interfaces (e.g., thermal ports). This rewrite operation is applied automatically as part of the parsing process. Finally, the "pretty-print" capability of the parser is used to recreate the Modelica source code for the augmented model from the AST.

For example, assume that an electric resistor is to be augmented with heat transfer capability. The idealized electric resistor in Modelica language is represented as showing in the code listing of FIG. 6. After augmentation, the resistor model will include a heat port and a new equation relating the electric power to the thermal power as shown in FIG. 7.

For EMI modeling, the information extracted from the CAD model gives the distance between two wires, the overlap and their material properties. This information enables us to compute the parasitic capacitance between the wires. For example, for two parallel cylindrical wires, the parasitic capacitance is given by $$C_\varepsilon = \frac{\pi \varepsilon l}{\text{arccosh}\left(\frac{d}{2a}\right)}$$

where ε is the permittivity, l is the wires length where they overlap, d is the distance between the centers of the wires, and a is the wire radius. Similar formulas can be determined for other geometries.

Figure 8:
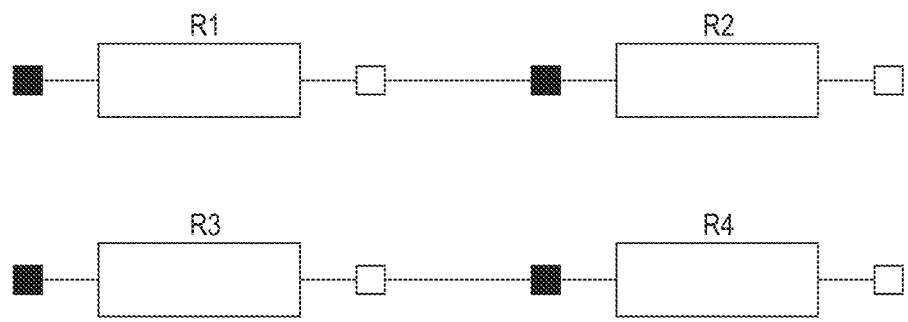
FIGS. 8 and 9 are circuit diagrams showing parasitic capacitive elements that may be used in an augmented lumper parameter model according to an example embodiment.
Figure 9:
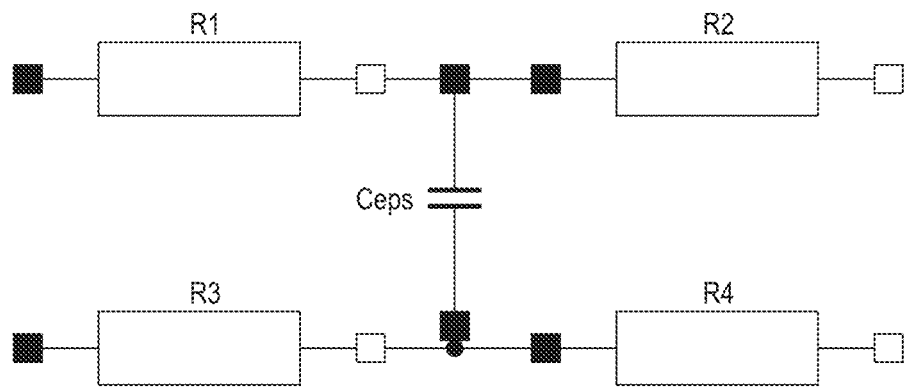

The diagrams in FIGS. 8 and 9 depict part of a Modelica model before and after model augmentation. The method detects that a wire between resistors R1 and R2, and between R3 and R4 exist. The method adds a parasitic capacitance Ceps between the two wires. To implement the changes shown in FIGS. 8 and 9, the model is automatically re-written and augmented with capacitor components by using the parsed model, that is, the AST representation. In the Modelica language representation, the diagram of FIG. 8 is shown modeled in the listing of FIG. 10. After augmentation, the diagram of FIG. 9 will be modeled as shown in the listing of FIG. 11.

In reference again to FIG. 2, the LP model augmentation 210 an augmented model 222 that encodes additional behavior for the unintended interactions due to heat dissipation and parasitic capacitances. The augmented model 222 is fed into the diagnosis engine 106 to detect and isolate system faults. In addition to diagnosis, the augmented model 222 can be used for other applications such as designing improved feedback control policies or to inform design decisions in subsequent system changes and improvements.

Figure 12:
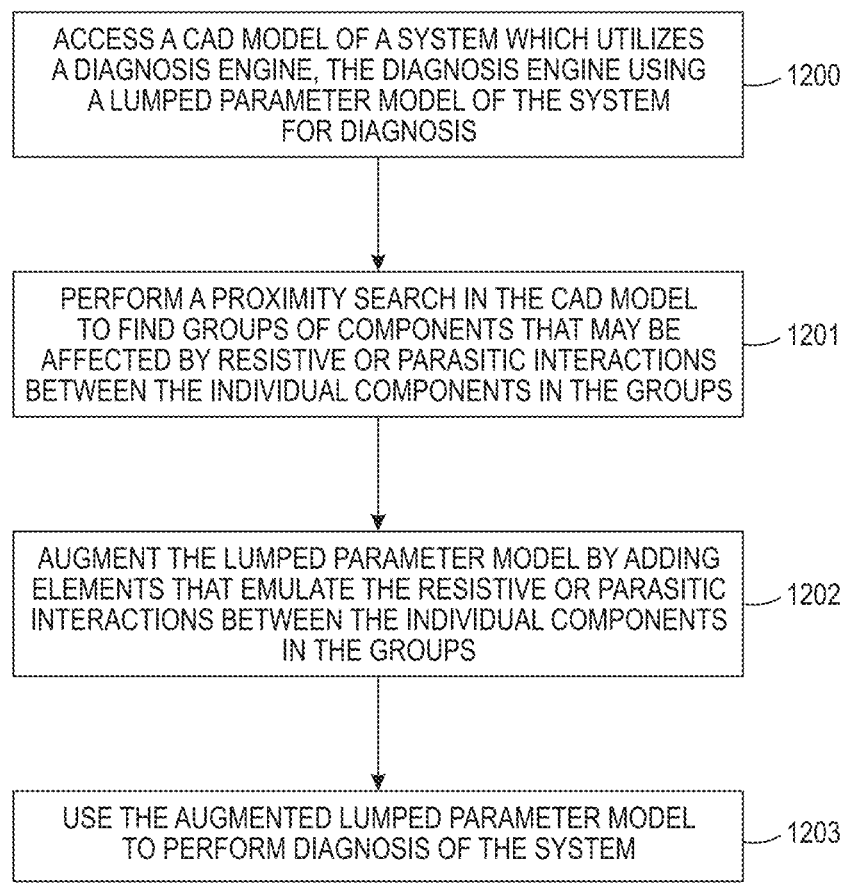
FIG. 12 is a flowchart of a method according to an example embodiment.

In FIG. 12, a flowchart shows a method according to an example embodiment. The method involves accessing a CAD model of a system which utilizes a diagnosis engine. The diagnosis engine uses a lumped parameter model of the system for diagnosis. The method involves performing 1201 proximity search in the CAD model to find groups of components that may be affected by resistive or parasitic interactions between the individual components in the groups. The lumped parameter model is augmented 1202 by adding elements that emulate the resistive or parasitic interactions between the individual components in the groups. The augmented lumped parameter model is used 1203 to perform diagnosis on the system.

Figure 13:
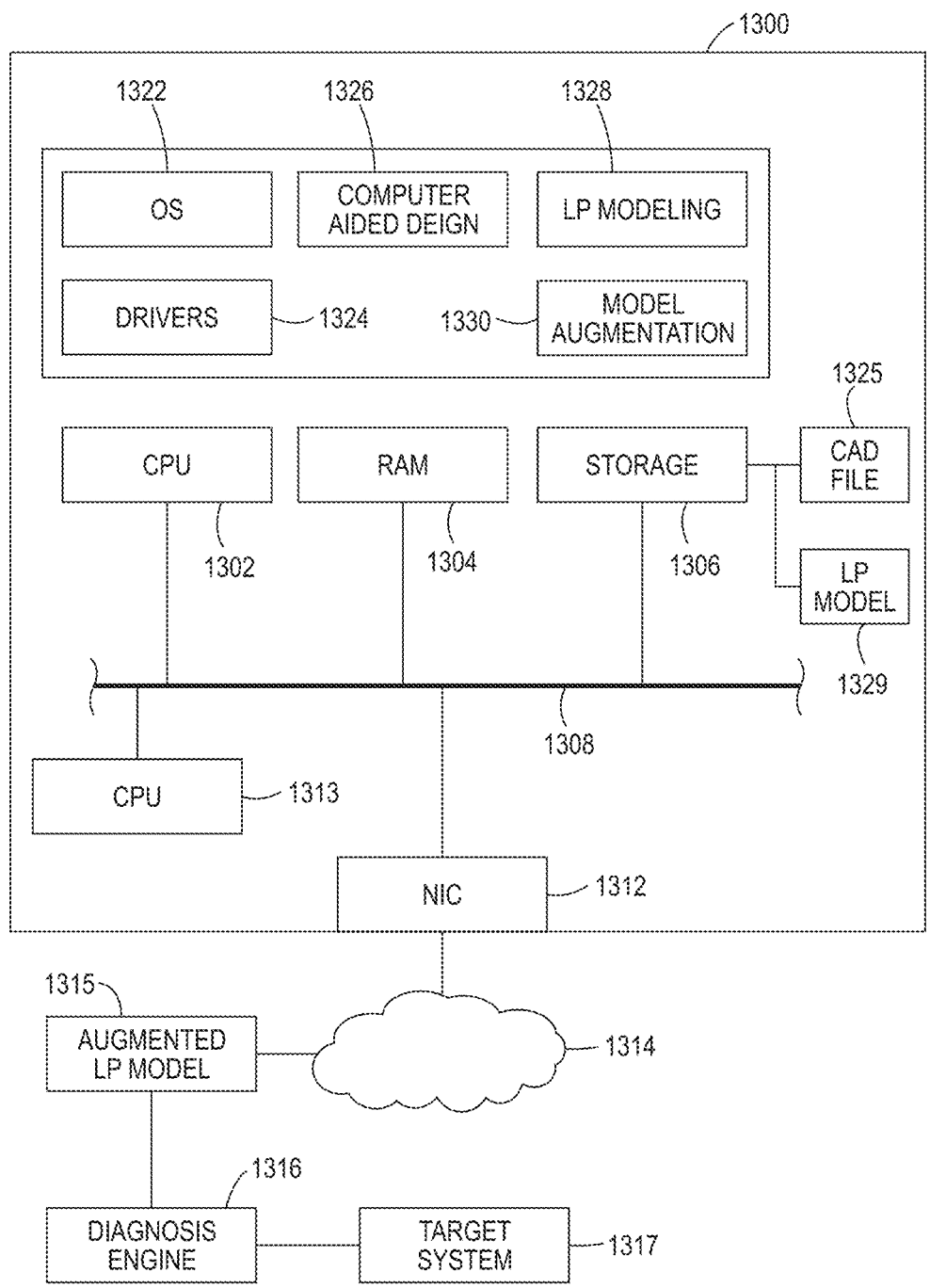
FIG. 13 is a block diagram of an apparatus and system according to an example embodiment.

The methods and processes described above can be implemented on computer hardware, e.g., workstations, servers, as known in the art. In FIG. 13, a block diagram shows an apparatus 1300 that may be used to implement methods according to an example embodiment. The apparatus 1300 includes one or more processors 1302 such as a central processing unit, co-processor, digital signal processor, etc. The processor 1302 is coupled to memory, which may include both random access memory 1304 and persistent storage 1306, via one or more input/output busses 1308. Other general-purpose or special-purpose hardware may be coupled to the bus 1308, such as graphics processing unit (GPU) 1313 and network interface 1312. Note that the functions of the apparatus 1300 described below may be implemented via multiple devices, e.g., via client-server arrangement, clustered computing, cloud computing, etc.

The network interface 1312 facilitates communications via a network 1314 with other computer, here shown as a diagnosis engine 1316, using wired or wireless media. Data may also be transferred to the diagnosis engine 1316 using non-network transport, e.g., via portable data storage drives, point-to-point communication, etc. Generally, the diagnosis engine 1316 includes one or more computer apparatuses that facilitate real-time or post-hoc diagnosis of a targeted mechanical and/or electrical system 1317. The target system 1317 includes instrumentation that monitors the system performance and is accessible by the diagnosis engine. The data transferred to the diagnosis engine 1316 may include at least an augmented LP model 1315.

The apparatus 1300 includes software 1320 that facilitates producing the augmented LP model 1315. The software 1320 includes an operating system 1322 and drivers 1324 that facilitate communications between user-level programs and the hardware. The software 1320 may also include a CAD module 1326 that can read geometry of systems monitored by the diagnosis system 1316, e.g., from a CAD file 1325. The CAD file 1325 may utilize any format, and may include computer-aided manufacturing models, two-dimensional or three-dimensional drafting/design, parametric models, etc. The CAD module 1326 will generally parse the CAD file 1325 to determine geometry of the analyzed parts as well as relations therebetween. The CAD file 1325 may be stored locally or remotely.

An LP modeler 1328 processes an LP model 1329 of the target systems 1317 monitored by the diagnosis engine 1316 as discrete elements, e.g., point mass objects, electronic components (e.g., resisters, capacitors), simplified mechanical components (e.g., springs, dampers), simplified heat transfer components (heat sources and sinks, thermal resistances and capacitances), etc. A model augmentation component 1330 analyzes the CAD model provided from the CAD module 1326 finds components that are also represented in the LP model 1329. The model augmentation component 1330 inserts new elements in the LP model to create the augmented LP model 1315, which is used by the diagnosis engine 1316.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. A method comprising:
    accessing a computer aided design (CAD) model of a system, the system utilizing a diagnosis engine, the diagnosis engine using a lumped parameter model of the system for diagnosis;
    analyzing the CAD model to determine components of the CAD model that are also represented in the lumped parameter model;
    performing a proximity search in the CAD model to find groups of the components that may be affected by resistive or parasitic interactions between individual components in the groups due to geometric adjacency between the individual components without direct contact;
    augmenting the lumped parameter model by adding new elements to the lumped parameter model that emulate the resistive or parasitic interactions between the individual components without direct contact in the groups; and
    using the augmented lumped model by the diagnosis engine to perform the diagnosis on the system.

2. The method of claim 1, wherein performing the diagnosis comprises at least one of real-time monitoring of the system.

3. The method of claim 1, wherein the proximity search in the CAD model involves computing a distance field for rigid bodies that represent the individual components, wherein at least one of the rigid bodies moves relative to others of the rigid bodies in the system, the distance field calculated using a workspace of the at least one rigid body.

4. The method of claim 3, wherein the proximity search comprises determining an exterior medial axis by evaluating non-differentiable points on the distance field at points outside the rigid bodies.

5. The method of claim 1, further comprising performing a component classification of an abstract syntax tree of the lumped parameter model to determine resistive components, wherein determining the resistive components comprises analyzing the abstract syntax tree to determine known resistive components.

6. The method of claim 5, wherein determining the resistive components comprises applying a machine learning regression algorithm to components of the abstract syntax tree to solve a constrained optimization problem.

7. The method of claim 5, wherein determining the resistive components comprises modeling wires based on connect statements, the resistive components comprising parasitic capacitance between the wires.

8. An apparatus comprising: a memory operable to store: a computer aided design (CAD) model of a system, the system utilizing a diagnosis engine; and
    a lumped parameter model of the system used by the diagnosis engine for diagnosis; and
    a processor coupled to the memory and operable to perform: analyzing the CAD model to determine components of the CAD model that are also represented in the lumped parameter model;
analyzing the CAD model to determine components of the CAD model that are also represented in the lumped parameter model;
performing a proximity search in the CAD model to find groups of the components that may be affected by resistive or parasitic interactions between individual components in the groups due to geometric adjacency between the individual components without direct contact;
augmenting the lumped parameter model by adding new elements to the lumped parameter model that emulate the resistive or parasitic interactions between the individual components without direct contact in the groups; and sending the augmented lumped model to the diagnosis engine to perform the diagnosis on the system.

9. The apparatus of claim 8, wherein the proximity search in the CAD model involves computing a distance field for rigid bodies that represent the individual components, wherein the proximity search comprises determining an exterior medial axis by evaluating non-differentiable points on the distance field at points outside the rigid bodies.

10. The apparatus of claim 8, wherein the processor is further operable to perform a component classification of an abstract syntax tree of the lumped parameter model to determine resistive components.

11. The apparatus of claim 10, wherein determining the resistive components comprises applying a machine learning regression algorithm to components of the abstract syntax tree to solve a constrained optimization problem.

12. The apparatus of claim 10, wherein determining the resistive components comprises modeling wires based on connect statements, the resistive components comprising parasitic capacitance between the wires.

13. A system comprising: a target system comprising instrumentation that monitors performance of the target system;
    a diagnosis engine coupled to the instrumentation of the target system and configured to perform a diagnosis on the target system using a lumped parameter model;
    and an apparatus comprising a processor configured to perform: analyzing a computer aided design (CAD) model of the system to determine components of the CAD model that are also represented in the lumped parameter model;
perform a proximity search in the CAD model to find groups of components that may be affected by resistive or parasitic interactions between individual components in the groups due to geometric adjacency between the individual components without direct contact;
augment the lumped parameter model by adding new elements to the lumped parameter model that emulate the resistive or parasitic interactions between the individual components without direct contact in the groups;
wherein the diagnosis engine is operable to use the augmented lumped model to perform the diagnosis on the system.

14. The system of claim 13, wherein performing the diagnosis comprises at least one of real-time monitoring of the system and performing a post-hoc diagnosis after a failure of the system.

15. The system of claim 13, wherein the proximity search in the CAD model involves computing a distance field for rigid bodies that represent the individual components.

16. The method of claim 1, wherein the new elements comprise at least one of point mass objects, electronic components, simplified mechanical components, and simplified heat transfer components.

17. The method of claim 1, wherein the new elements that emulate the resistive or parasitic interactions represent unintended interactions between the individual components that are not included in the lumped parameter model.

18. The method of claim 17, wherein the individual components are not in direct contact or otherwise connected with one another in the CAD model.

19. The apparatus of claim 8, wherein the individual components are not in direct contact or otherwise connected with one another in the CAD model and wherein the resistive or parasitic interactions represent unintended interactions that are not included in the lumped parameter model.

20. The system of claim 13, wherein the individual components are not in direct contact or otherwise connected with one another in the CAD model and wherein the resistive or parasitic interactions represent unintended interactions that are not included in the lumped parameter model.

\* \* \* \* \*